United States Patent [19]

Carter

[11] Patent Number: 4,642,487

[45] Date of Patent: Feb. 10, 1987

[54] SPECIAL INTERCONNECT FOR CONFIGURABLE LOGIC ARRAY

[75] Inventor: William S. Carter, Santa Clara, Calif.

[73] Assignee: Xilinx, Inc., San Jose, Calif.

[21] Appl. No.: 655,007

[22] Filed: Sep. 26, 1984

[51] Int. Cl.[4] .......................................... H03K 17/693
[52] U.S. Cl. .................................... 307/465; 307/303; 307/468
[58] Field of Search .............................. 307/465-469, 307/572, 577, 579, 584, 585, 303; 364/491, 716; 340/825.22, 825.83

[56] References Cited

U.S. PATENT DOCUMENTS

| | | | |
|---|---|---|---|
| 4,032,894 | 6/1977 | Williams | 307/466 X |
| 4,157,589 | 6/1979 | Kapral et al. | 364/716 |
| 4,307,379 | 12/1981 | Wyland | 340/825.83 |
| 4,541,067 | 9/1985 | Whitaker | 364/716 |
| 4,541,114 | 9/1985 | Rutenbar et al. | 364/491 X |
| 4,558,236 | 12/1985 | Burrows | 307/469 X |
| 4,564,773 | 1/1986 | Tanizawa et al. | 307/465 X |

OTHER PUBLICATIONS

Mead and Conway, *Introduction to VLSI Systems*, Addison-Wesley Pub. Co., Reading, Mass., Oct. 1980, pp. 150-162.

Machart et al, "General Function Circuit", *IBM T. D. B.*, vol. 15, No. 1, Jun. 1972, p. 11.

Gamblin et al, "Thin Film Universal Logic Block", *IBM T. D. B.*, vol. 9, No. 6, Nov. 1966, pp. 662-664.

*Primary Examiner*—Stanley D. Miller
*Assistant Examiner*—D. R. Hudspeth
*Attorney, Agent, or Firm*—Alan H. MacPherson; Steven F. Caserza; Richard Franklin

[57] ABSTRACT

A special interconnect circuit which connects adjacent configurable logic elements (CLEs) in a configurable logic array (CLA) without using the general interconnect structure of the CLA. In one embodiment, an array of CLEs is arranged in rows and columns and a special vertical lead circuit is provided which connects an output lead of a given CLE in a given column to a selected input lead of the CLE above it and below in the same column. Special horizontal lead circuits are provided which connect a given output lead of a given CLE to a selected adjacent input lead of the CLE in the same row.

3 Claims, 35 Drawing Figures

|   | C | 0 | 1 | 1 | 0 |
|---|---|---|---|---|---|
| A | D | 0 | 0 | 1 | 1 |
| B |   |   |   |   |   |
| 0 0 |  | 1 | 0 | 0 | 0 |
| 1 0 |  | 0 | 0 | 0 | 0 |
| 1 1 |  | 0 | 0 | 0 | 0 |
| 0 1 |  | 0 | 0 | 0 | 0 |

─)─ = (i.e., Crossover without Connection or Possibility of Connection)

─┼─ or ─┼─ = (i.e., Can Only be Connected or Disconnected, As Input or Output, But Cannot be Broken)

─┼■─ = Full Interchange - e.g. Figure 7B-7

─✳─ = Full Interchange - e.g. Figure 7B-3

─✳─ = Partial Interchange: ┘ ┘ ┘ ┘ e.g. Fig. 7B-6

─✳─ = Intersections are Intended to be Low Skew Lines (4 Vertical Shown) that do not have (i.e., Clock or Other) Paths.

─▶─ = Directional Amplifier (Direction is Selectable) to Prevent Signal Drooping Through too Many Pass Devices.

FIG 4b

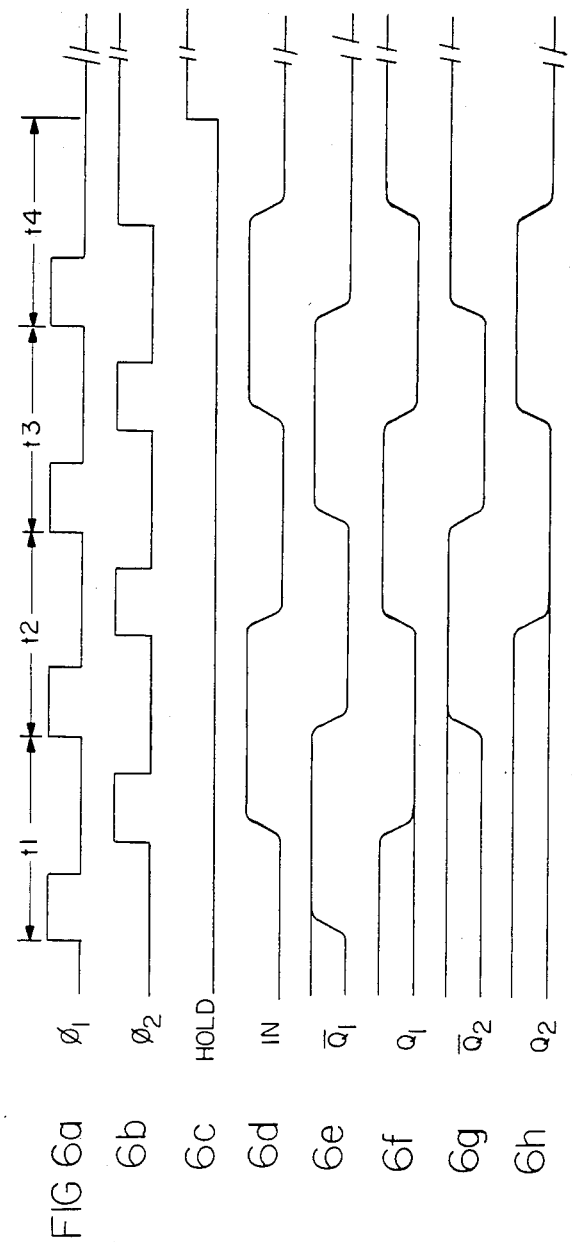

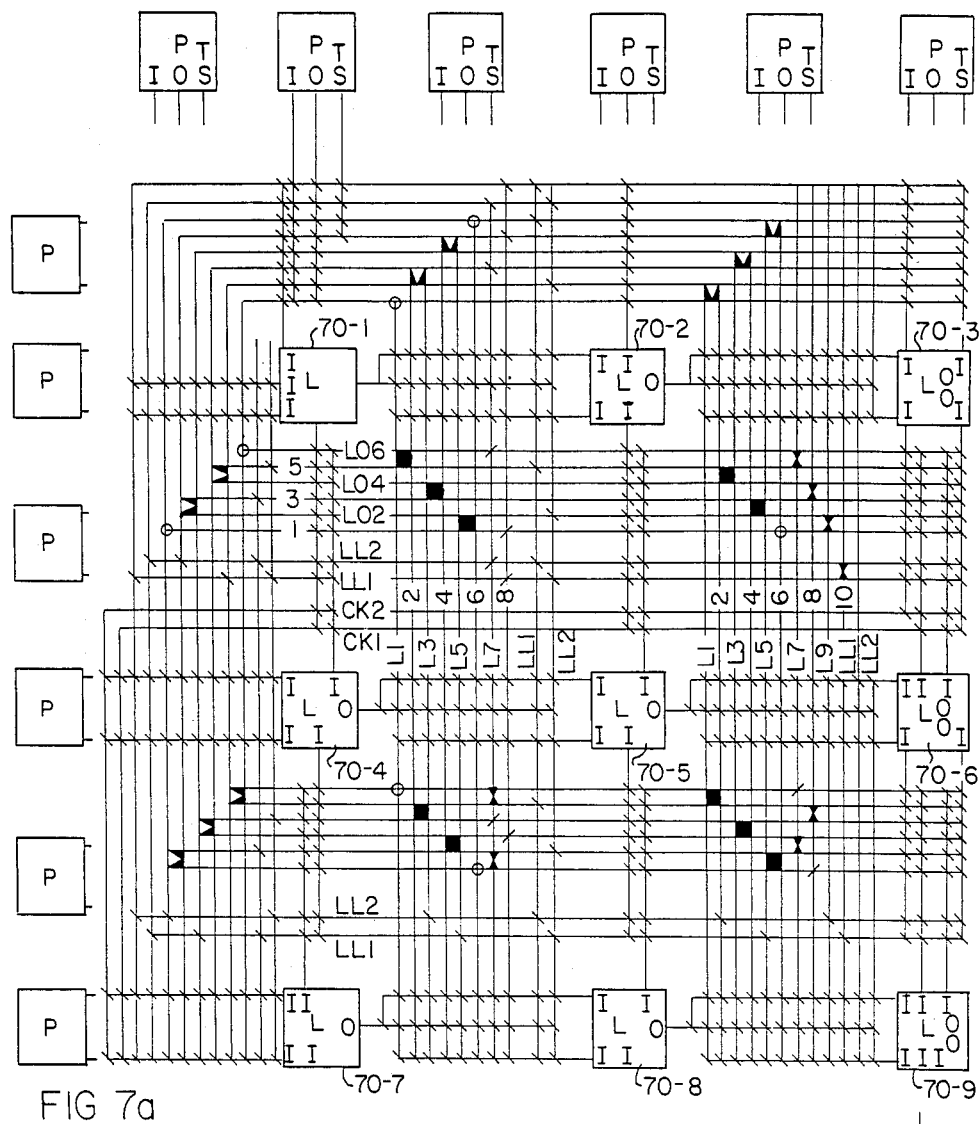
FIG 7a
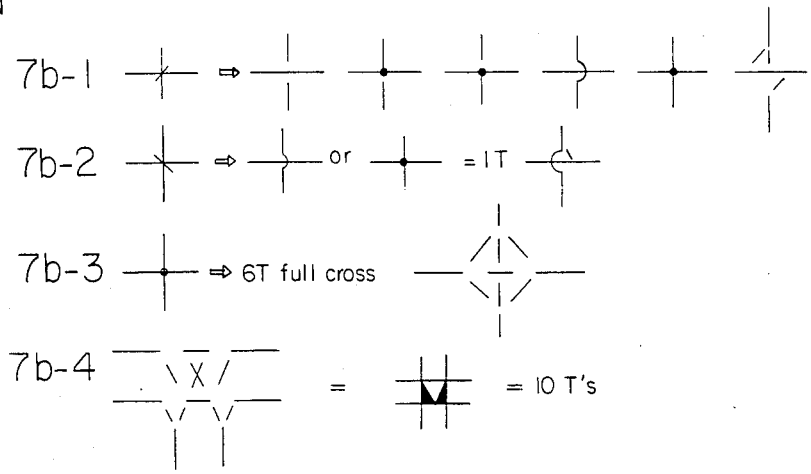

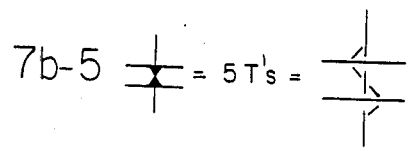
7b-5 = 5 T's =
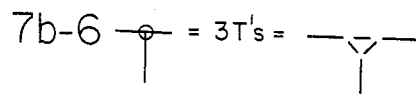
7b-6 = 3 T's =
20 T interchange
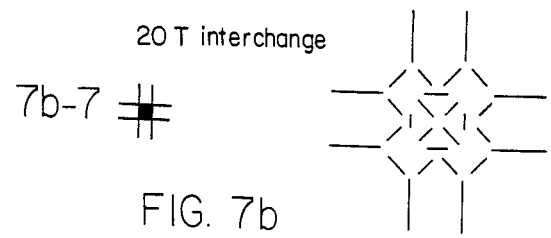
7b-7
FIG. 7b
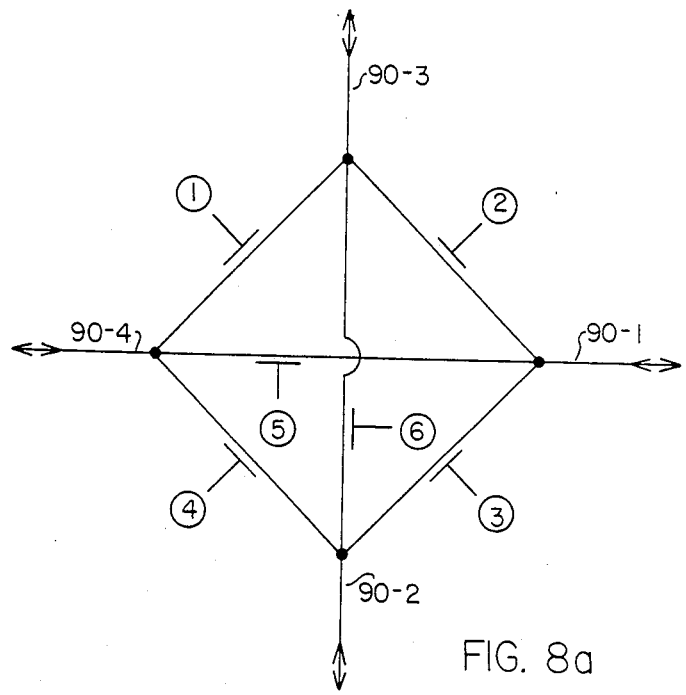
FIG. 8a

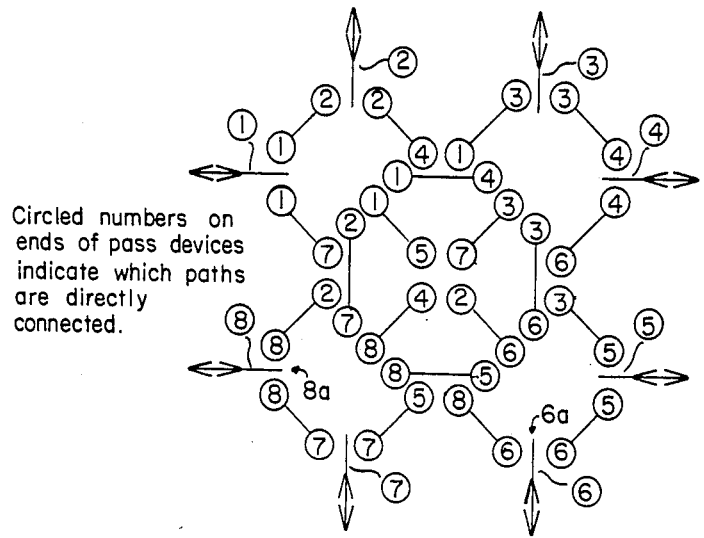
Circled numbers on ends of pass devices indicate which paths are directly connected.
FIG. 8d
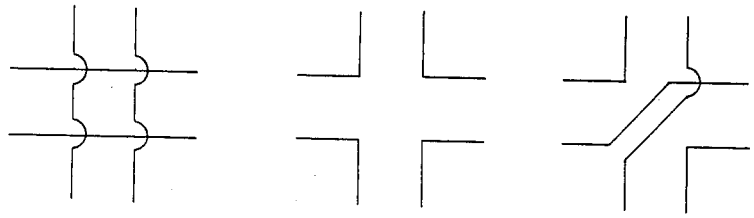
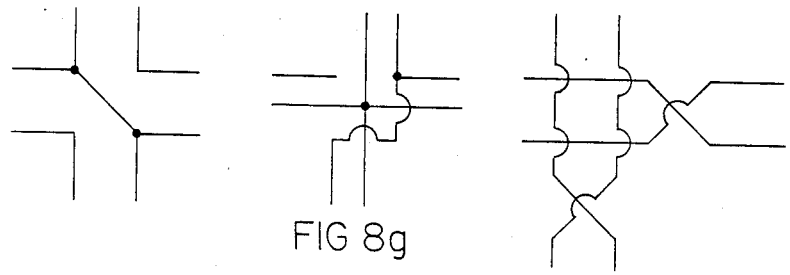
FIG 8g
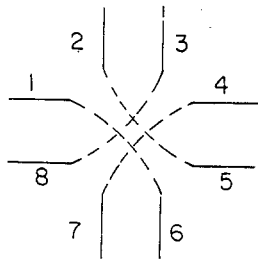
FIG. 8e
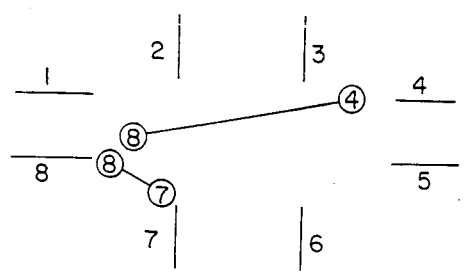
FIG. 8f

| LEAD A | PASS TRANSISTER | LEAD B |
|---|---|---|
| 91-6 | 92-1 | 91-5 |
| 91-6 | 92-2 | 91-4 |
| 91-6 | 92-3 | 91-2 |
| 91-6 | 92-4 | 91-1 |
| 91-1 | 92-5 | 91-5 |
| 91-2 | 92-6 | 91-5 |
| 91-1 | 92-7 | 91-4 |
| 91-6 | 92-8 | 91-3 |
| 91-1 | 92-9 | 91-3 |
| 91-2 | 92-10 | 91-3 |
| 91-3 | 92-11 | 91-4 |
| 91-3 | 92-12 | 91-5 |
| 91-2 | 92-13 | 91-4 |

SPECIAL INTERCONNECT FOR CONFIGURABLE LOGIC ARRAY

FIELD OF THE INVENTION

This invention relates to programmable logic arrays and in particular to on-chip special programmable interconnection circuits between selected adjacent configurable logic elements in a configurable logic array (CLA).

BACKGROUND OF THE INVENTION

As explained in detail later, a "configurable logic element" (also referred to herein as a logic element) is a combination of devices which are capable of being electrically interconnected by switches operated in response to control bits to form any one of a plurality of logical functions.

Each configurable logic element (CLE) can include all the circuit elements necessary to provide one or more of the functions provided by an AND gate, flip flop, latch, inverter, NOR gate, exclusive OR gate, and combinations of these functions to form more complex functions. The particular function to be carried out by a configurable logic element is determined by control signals applied to the configurable logic element from control logic. Depending on the control signals, the configurable logic element can function as an AND gate, an OR gate, a NOR gate, a NAND gate or an exclusive OR gate or any one of a number of other logic elements without any change in physical structure. The control logic stores and generates control signals which control the configuration of each configurable logic element.

The control logic is typically formed integrally with and as part of the integrated circuit chip containing the configurable logic element. However, if desired the control information can be stroed and/or generated outside this integrated circuit and transmitted through pins to the configurable logic element.

In general, a given set of control signals is transmitted to one configurable logic element to control the configuration of that configurable logic element. The control logic is thus arranged to provide any one set of a plurality of sets of control bits to each configurable logic element on the chip. The actual set of control bits provided to each configurable logic element on the integrated circuit chip depends on the function to be carried out by the integrated circuit chip or by each configurable logic element on the chip. The configuration of each logic element on the chip is determined by the intended function of the total chip and by the intended formation of that configurable logic element as part of the chip.

A configurable logic array (CLA) comprises a plurality of CLEs, each having one or more input leads and one or more output leads, a set of access junctions for each input lead and for each output lead, and a general interconnect structure. The general interconnect structure comprises a plurality of general interconnect leads and a plurality of general interconnect junctions. The general interconnect structure has the property that for each lead in the general interconnect structure, there is a programming of the general interconnect junctions which connects the given general interconnect leads to one or more other general interconnect leads by means of a general interconnect junction. An access junction is a programmable junction for connecting a general interconnect lead to an input lead of a CLE or for connecting an output lead of the CLE to a general interconnect lead.

A CLA has the property that there is always a programming of the junctions (both access and general interconnect) so that a given output lead of a given CLE within the CLA can be connected to a given input lead of any other CLE within the CLA.

The junctions in the general interconnect structure and the access junctions are programmed by control signals generated by the control logic described above. A selection of control signals to configure each CLE in a CLA together with a selection of control signals to configure the access junctions and the junctions of the general interconnect structure results in one configuration of the CLA.

Frequently, when interconnecting logic elements in a configurable logic array, the access junctions and the junctions of the general interconnect structure are programmed so that the output of one logic element is only connected to one or two other logic elements. If the logic elements that are interconnected are physically close together (and they typically will be placed that way to facilitate interconnecting), I have discovered that a significant amount of general interconnect structure can be eliminated if special interconnect is provided which allows selected logic elements to be interconnected, i.e., the special interconnect reduces the utilization of the general interconnect structure provided may be reduced, thus reducing die size. Also, the speed of signals through this special interconnect will be improved since the number of junctions and the amount of capacitance on the path will be reduced. This type of interconnect is particularly useful when implementing MSI type functions, e.g., shift registers and counters, where adjacent logic elements must be interconnected.

SUMMARY OF THE INVENTION

This invention provides special interconnect circuitry which connects selected CLEs in a CLA without using the general interconnect structure. In one embodiment for a CLA containing at least a first, a second, a third and a fourth CLE, a special interconnection circuit is provided which permits an output signal on a first output lead of the second CLE to be connected to a selected input lead of the first and third CLE and permits an output signal on a second output lead of the second CLE to be connected to a selected input lead in the fourth CLE. Typically the first and third CLE are in the same column as the second CLE and the fourth CLE is in the same row as the second CLE.

The use of the special interconnect circuits of the invention reduces the use of the general interconnect structure. The reduction in the utilization of the general interconnect structures is so substantial that in many embodiments the number of general interconnect leads and the number of general interconnect junctions is reduced, thus reducing die size.

This invention will be more fully understood with reference to the following detailed description and accompanying drawings.

DESCRIPTION OF THE DRAWINGS

FIG. 4B shows the key to the cross-connections between crossing conductive leads in FIG. 4A;

FIGS. 6A through 6H represent wave forms of use in explaining the operation of the structure of FIG. 5;

FIG. 7A represents a schematic diagram of a configurable logic array showing nine of N configurable logic elements where N is a selected integer greater than 9 and selected interconnections between conductive leads;

FIG. 7B-1 through 7B-7 form the key showing the types of interconnections made by the symbols shown in FIG. 7A;

FIGS. 8A through 8G illustrate various topologies for forming interconnections between two or more leads of a configurable logic array;

FIG. 11 lists the pass transistor connecting lead A with level B in FIG. 8B.

DETAILED DESCRIPTION

The following detailed decription of this invention is meant to be illustrative only and not limiting. Other embodiments of this invention will be obvious to those skilled in the art in view of the following disclosure.

Copending U.S. application Ser. No. 588,478, filed Mar. 12, 1984, on an invention of Ross H. Freeman entitled "Configurable Logic Array" is incorporated herein by reference.

It is necessary to explain the configurable logic elements and general interconnect structure of the configurable logic array described in the above copending application in order to explain the special interconnect structure of the present invention.

Figure 1:
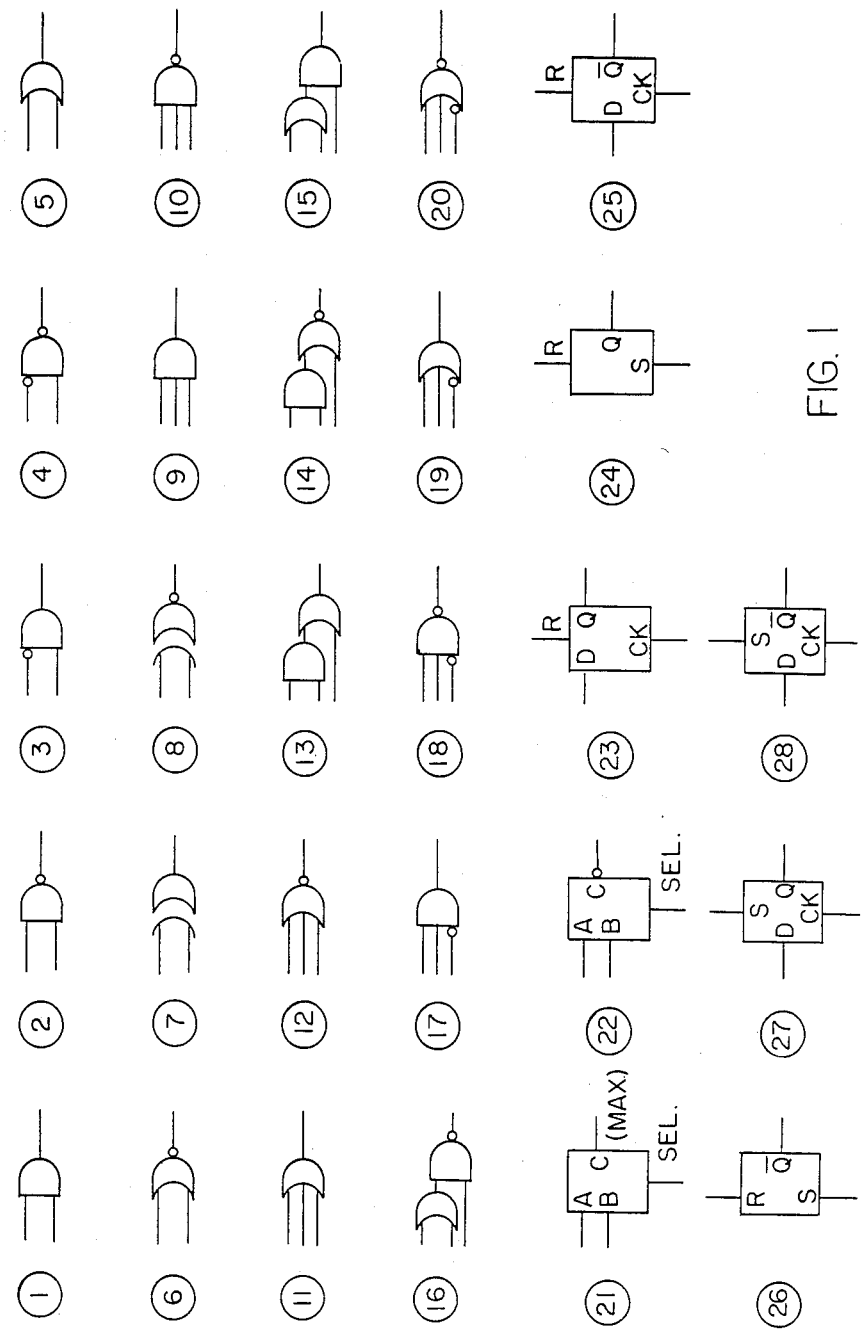
FIG. 1 illustrates some of the various logic functions capable of being implemented in each logic element in a configurable logic array.

FIG. 1 illustrates certain logic functions capable of being implemented by a configurable logic element. The 28 functions shown in FIG. 1 are merely illustrative and other elements not shown can, if desired, be implemented by a configurable logic element. The following functions are shown:

| Element | Function |
| --- | --- |
| 1 | AND gate |
| 2 | NAND gate |
| 3 | AND gate with inverted input |
| 4 | NAND gate with inverted input |
| 5 | OR gate |
| 6 | NOR gate |
| 7 | exclusive OR gate |
| 8 | exclusive NOR gate |
| 9 | 3 input AND gate |
| 10 | 3 input NAND gate |
| 11 | 3 input OR gate |
| 12 | 3 input NOR gate |
| 13 | OR gate with one input comprising AND gate |
| 14 | NOR gate with one input comprising AND gate |
| 15 | AND gate with one input comprising OR gate |
| 16 | NAND gate with one input comprising OR gate |
| 17 | 3 input AND gate with one input inverted |
| 18 | 3 input NAND gate with one inverted input |
| 19 | 3 input OR gate with one inverted input |
| 20 | 3 lead NOR gate with one inverted input |
| 21 | one of two inputs multiplexer |
| 22 | inverting one of two inputs multiplexer |
| 23 | "D" flip flop with reset |
| 24 | Set-Reset latch |
| 25 | "D" flip-flop with reset and inverted output |
| 26 | Set-reset latch with reset and inverted output |
| 27 | "D" flip-flop with set |
| 28 | "D" flip-flop with set and inverted output |

Of course, other logic functions can also be implemented in a configurable logic element.

Figure 2:
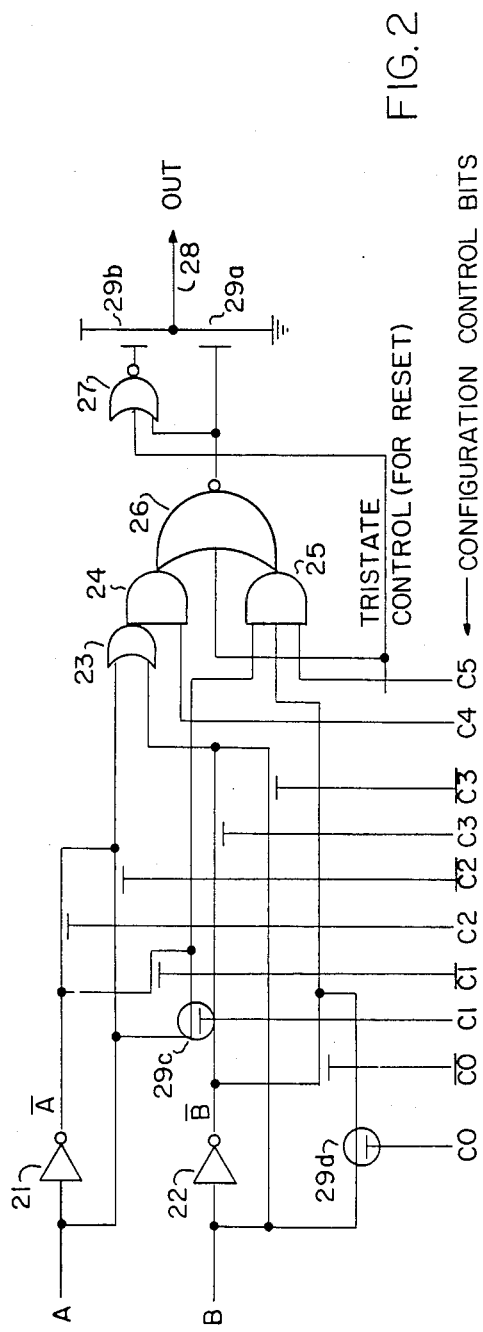
FIG. 2 illustrates the internal logic structure of one possible configurable logic element capable of implementing a number of useful functions of two variables A and B.

FIG. 2 illustrates the internal logic structure of one possible configurable logic element which is capable of implementing all useful basic functions of the two variables A and B, with the functions being selected by configuration control signals C0, $\overline{C0}$, C1, $\overline{C1}$, ... through C5 on control leads C0, $\overline{C0}$, ... through C5. In this example each control lead is connected to the gate of an N channel enhancement mode pass transistor. To implement an AND gate function using the structure shown in FIG. 2, the input leads labeled A and B are shunted past inverters 21 and 22, respectively, to AND gate 25 by high level signals on the C1 and C0 configuration control leads which, being connected to the gates of N channel enhancement mode pass transistors 29c and 29d, cause pass transistors 29c and 29d to turn on.

Low level signals are applied to the configuration control leads $\overline{C0}$ and $\overline{C1}$, thus blocking the output signals of inverters 21 and 22 from AND gate 25. In addition, a high level signal on lead C5 is applied to enable AND gate 25. Thus three input AND gate 25 functions as a two-input AND gate with respect to the signals A and B. The output signal of AND gate 25 provides one input signal to NOR gate 26. A second input signal to NOR gate 26 is provided by the output signal of AND gate 24. The output signal of AND gate 24 is held at a logical 0 by applying a logical 0 to configuration control lead C4. Thus the control signals C2 and C3 are "don't cares", that is, these signals can be high or low without affecting the output signal of AND gate 24. Since the output signal of AND gate 24 is a logical 0, and since the tristate control input signal to NOR gate 26 is a logical 0, it is easy to see that AND gate 25, AND gate 24 and NOR gate 26 function together as a NAND gate with respect to input signals A and B. Since the tri-state control signal input to NOR gate 27 is a logical 0 (except during reset), NOR gate 27 serves as an inverter with respect to the ouput signal of NOR gate 26. The output signal of NOR gate 26 is applied to the gate of N channel transistor 29a (the source of which is grounded and the drain of which is connected to output lead 28) and the complement of the output signal of NOR gate 26 is applied to the gate of N channel transistor 29b (the source of which is connected to a power supply and the drain of which is connected to both the output lead 28 and the drain of N channel transistor 29a). Thus, transistors 29a and 29b function as an inverter with respect to the output signal of NOR gate 26. Thus, the structure of FIG. 2 configured as described above performs the function of an AND gate with respect to the signals A and B. Other logic functions can also be produced by appropriate selection of the control signals to be supplied to the configuration control leads C0 through C5 to activate the appropriate pass transistors and gates within the structure.

Figure 3B:
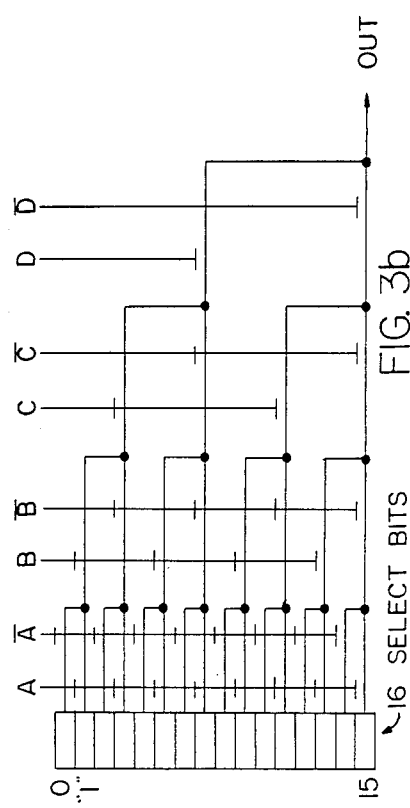
FIG. 3B illustrates a selection structure for selecting any one of sixteen bits capable of implementing $2^{16}$ functions, for transmittal to an output lead.
Figure 3A:
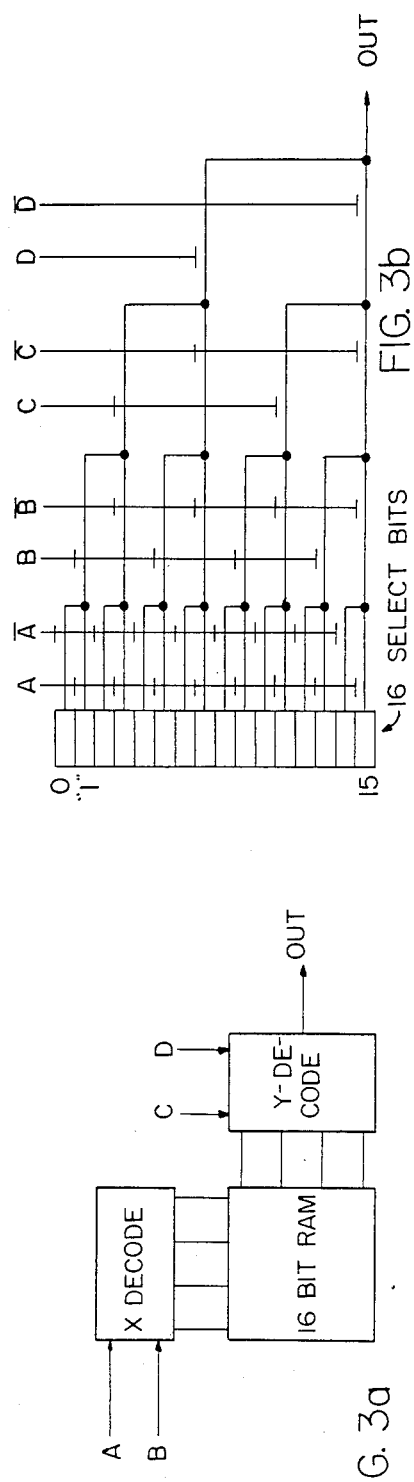
FIG. 3A illustrates a 16 bit RAM circuit wherein any one of sixteen possible input states is capable of being identified and $2^{16}$ functions are capable of being implemented.
Figures 3C, 3D:
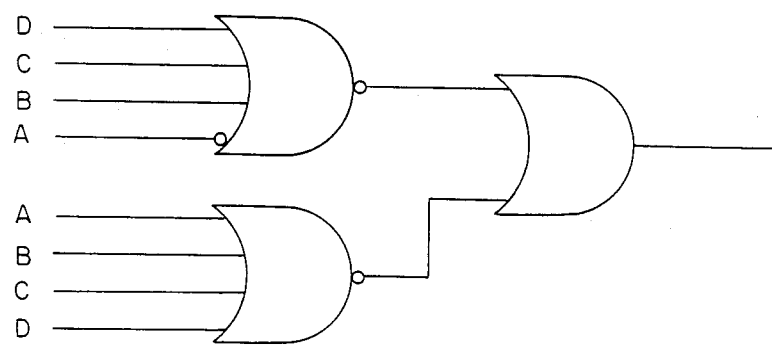
FIG. 3C illustrates one possible Karnaugh map for the structure of FIG. 3A.
FIG. 3D illustrates the logic gates represented by placing a binary one in the Karnaugh map of FIG. 3C at the intersections of the first and second rows and the first column.

FIG. 3A illustrates a 16 bit RAM capable of producing an output signal in response to any one of sixteen possible combinations of input signals. Thus input signals A and B control the X decoder to select any one of the four columns in the 16 bit RAM. Input signals C and D control the Y decoder to select any one of the four rows in the 16 bit RAM. The 16 bit RAM produces an output signal representative of the bit at the intersection of the selected row and column. There are 16 such intersections and thus sixteen such bits. There are $2^{16}$ possible combinations of functions capable of being represented by 16 bits. Thus, if a NOR gate is to be simulated by the 16 bits in the RAM, the Karnough map for the RAM would be as shown in FIG. 3C. In FIG. 3C all bits are "0" except the bit at the intersection of the first row (representing A=0, B=0) and the first column (representing C=0, D=0). Should a less frequently used function be desired to be generated by the 16 bit RAM, (for example, should a "1" output signal be desired for A=1, B=0, C=0 and D=0) then a binary "1" is stored at the intersection of the second row and the first column. Should a binary "1" be desired both when A=0, B=0, C=0 and D=0 and also when A=1, B=0, C=0 and D=0, then a binary "1" is stored at each of the intersections of the first column with the first row and the second row. The logic circuit represented by this loading of the RAM is as shown in FIG. 3D. Thus the RAM of FIG. 3A represents an elegant and simple implementation of any one of $2^{16}$ logic functions.

FIG. 3B shows another structure for yielding any one of sixteen select bits. Each of registers 0–15 in the vertical column to the left labeled "16 Select Bits", contains a selected signal, either a binary 1 or 0. By selecting the proper combination of A, B, C, and D, a particular bit stored in a particular one of the sixteen locations in the 16 Select Bits register is transmitted to the output lead. Thus, for example, to transmit the bit in the "1" register to the output lead, the signal A, B, C, D is applied to the leads so labeled. To transmit the signal labeled "15" in the sixteenth location in the 16 Select Bits register to the output lead, the signal A, $\overline{B}$, $\overline{C}$, and $\overline{D}$ is applied to the appropriate columns. Again, any one of $2^{16}$ logic functions can be implemented using this structure.

Figure 4A:
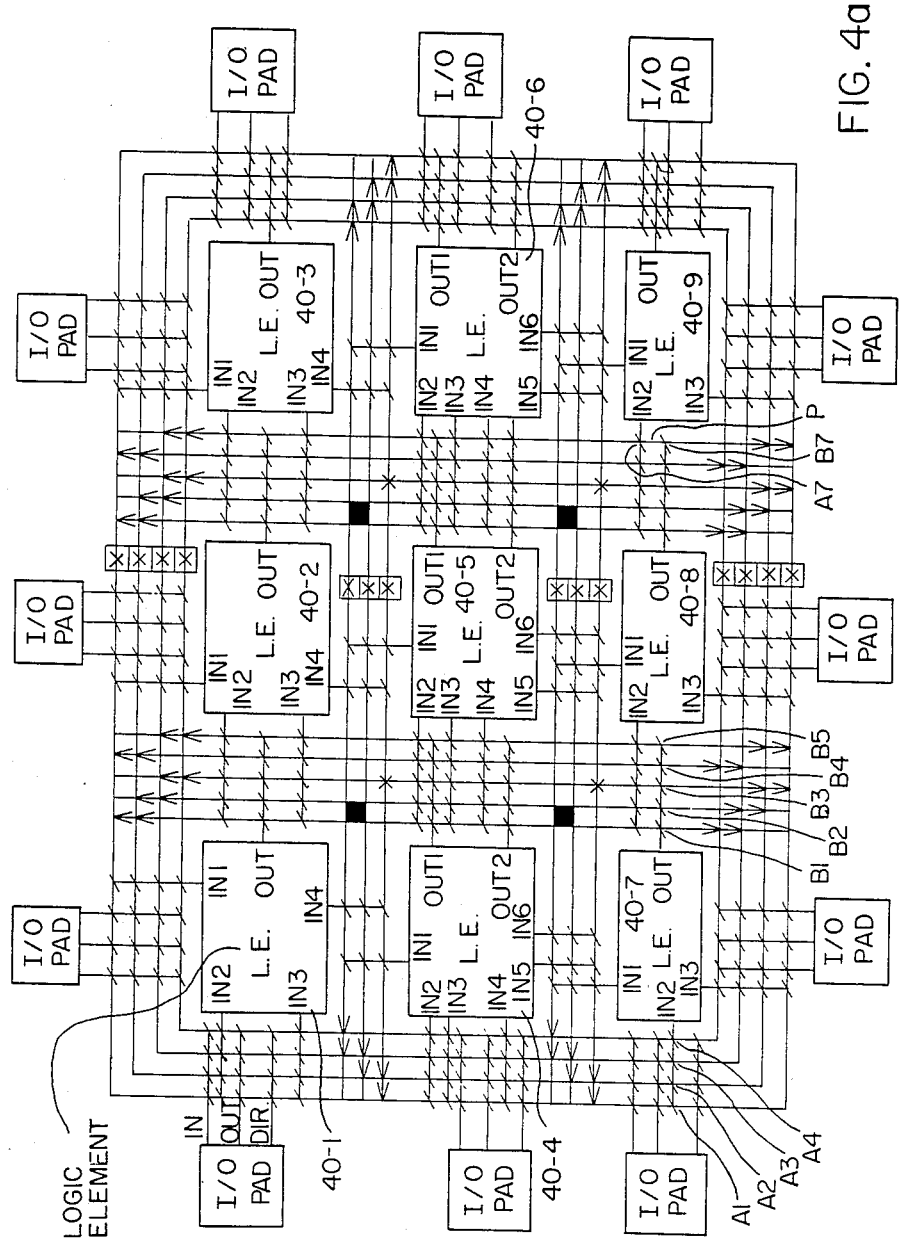
FIG. 4A illustrates a plurality of configurable logic elements (shown as nine logic elements) formed on an integrated circuit chip together with programmable interconnects formed between selected leads to yield desired logic functions and with selected input/output pads and interconnections of the leads between logic elements.

FIG. 4A illustrates a configurable logic array containing nine configurable logical elements. As shown in FIG. 4a, each CLE of the nine CLEs 40-1 through 40-9 has a plurality of input leads and one or more output leads. Each input lead has a plurality of access junctions each connecting a selected general interconnect lead to the input lead. The access junctions for input lead 2 of CLE 40-7 are labeled A1 through A4 in FIG. 4a. The access junctions for the other input leads are indicated schematically but are not labeled for the sake of clarity. Similary, each output lead of each CLE has a plurality of access junctions each connecting the output lead to a corresponding one of the general interconnect leads. The access junctions are indicated schematically for each output lead of each CLE in FIG. 4a. The access junctions for the output lead of CLE 40-7 are labeled B1 through B5. The leads in FIG. 4a which are neither input leads nor output leads are called general interconnect leads and the junctions in FIG. 4a which are not access jucntions for input and output leads are called general interconnect junctions. As shown in FIG. 4A, nine logic elements are placed on an integrated circuit chip together with programmable access junctions and a general interconnect structure which comprises general interconnect leads and programmable general interconnect junctions for connecting various leads to other leads. The general interconnect structure set of general interconnect leads and of programmable junctions interconnecting the general interconnect leads have the property that for each general interconnect lead in the general interconnect structure there is a programming of the general interconnect junctions which connects the given general interconnect lead to one or more other leads in the general interconnect structure. Moreover, there is a programming of the junctions (both access and general interconnect) such that for any given output lead of any CLE in the CLA, and for any given input lead of any other CLE in the CLA, the given output lead is connected to the given input lead. An electrical path from a given output lead to a given input lead always contains at least two access junctions and at least a portion of a general interconnect lead. For example, one electrical path from the output lead of CLE 40-8 to the second input lead of CLE 40-9 contains access junctions A7 and B7 and the marked portion P of a general interconnect lead. Typically, an electrical path from an output lead of one CLE to an input lead of another CLE will also contain one or more general interconnect junctions. Each of logic elements 40-1 through 40-9 represents a collection of circuitry such as that shown in FIG. 2 or some similar structure capable of being configured as described above in FIG. 2 to perform any one of a number of logic functions. To program the circuitry (both the configurable interconnect switches and the configurable logic elments), selected signals are applied to input leads identified as configuration control input leads thereby to generate a desired logical function in each of the logic elements and to interconnect the logic elements as desired. In FIG. 4A, no specific lead has been identified as an input lead for the configuration control signals. However, any particular I/O pad can be selected for this purpose. The configuration control bits can be input into the configurable logic array either in series or in parallel depending upon design considerations where they are typically stored in a programming register (not shown). Alternatively, the configuration control bits may be stored in a memory on chip. In addition, another I/O pad will be used to input clock signals which are used, inter alia, for the loading of the configuration control signals into the programming register. When the configurable logic array shown in FIG. 4A has been configured, selected output signals of logic elements 40-1 through 40-9 are provided to selected I/O pads. FIG. 4B illustrates the meaning of the junction symbols used in FIG. 4A.

Figure 5:
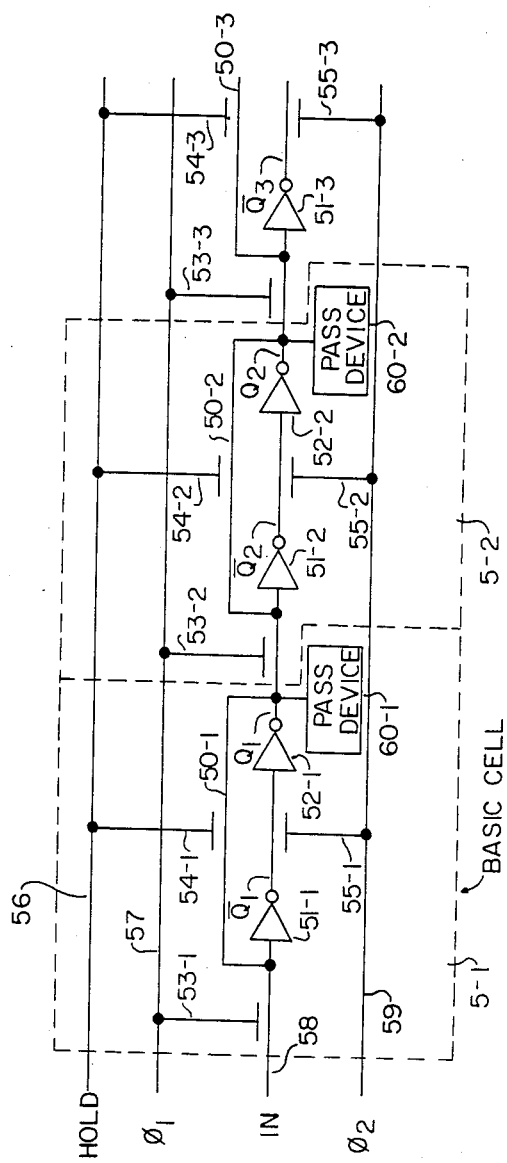
FIG. 5 represents a portion of the circuitry of a novel combination static and dynamic shift register appropriate for use with the configurable logic array of this invention.

To configure a logic element such as logic element 40-1 (FIGS. 4A, 4B) a number of bits must be applied to the configuration control leads such as leads C0 through C5, as shown, for example, in FIG. 2. To do this, a shift register, for example, is utilized as part of each configurable logic element. FIG. 5 illustrates a shift register which may be used. The shift register of FIG. 5 is illustrated showing two basic storage cells. Each storage cell is capable of storing one bit of information. Of course, an actual shift register will contain as many storage cells as required to configure the logic element of which the shift register is a part, to its desired configuration. In operation, an input signal is applied to input lead 58. This input signal (shown in FIG. 6D) contains a bit stream to be stored in the shift register as configuration control bits to configure the configurable logic element to perform a desired logic function or to configure (program) an access junction or a general interconnect junction between general interconnect leads in a manner to be described shortly. Thus the sequence of pulses applied ot input lead 58 represents those pulses which when stored in the storage cells of the shift register will activate the configuration control bits in the proper manner to achieve the desired functional and/or interconnection result. For example, if the circuit of FIG. 2 is to be configured to form an AND gate, the pulses C0, C1, C2, C3, C4, and C5 would be represented by 1,1,X,X, 0,1.

The sequence of pulses applied to input lead 58 is synchronized with clocking pulses $\phi 1$ and $\phi 2$ applied to leads 57 and 59 respectively. Thus in the first period of operation clocking pulse $\phi 1$ goes high (FIG. 6A), clocking pulse $\phi 2$ is low (FIG. 6B), the hold signal (FIG. 6C) is low during shifting thereby facilitating the passage of data through sequentially connected cells 5-1, 5-2 et al. of the shift register. To shift the pattern 01010 into the shift register, the following operations occur: The input signal on lead 58 is low during approximately the first half cycle of the clocking period t1. The output signal $\overline{Q1}$ of inverter 51-5 goes to a high level in response to the low level input signal and $\phi 1$ high to enable pass transistor 53-1. Some time through the first clocking period t1, the clock signal $\phi 1$ goes low (FIG. 6A) and the clock signal $\phi 2$ shortly thereafter goes high (FIG. 6B) to enable pass transistor 55-1. Consequently, the high level output signal $\overline{Q1}$ is transmitted to the input lead of inverter 52-1 by enabled pass transistor 55-1 and thereby produces a low level output signal Q1 on the output lead of inverter 52-1. Thus at the end of period t1, the output signal Q1 (FIG. 6F) from inverter 52-1 is low level. The output signals $\overline{Q2}$ and Q2 from inverters 51-2 and 52-2 in the second cell are still indeterminate because on known signal has yet propagated to the second storage cell 5-2 to change the signals of these inverters to a known state.

At the beginning of the second period (labeled "t2" in FIG. 6A), $\phi 1$ goes high (FIG. 6A) and $\phi 2$ is low (FIG. 6B) having gone low before period t1 ended. The input signal (FIG. 6D) now has risen to a high level representing a binary 1 and thus the output signal $\overline{Q1}$ of inverter 51-1 has gone low. The output signal Q1 of inverter 52-1 remains low because pass transistor 55-1 is held off by the low level $\phi 2$ signal. Some time through the second period $\phi 1$ goes low followed a fraction of time later by $\phi 2$ going high. At this time, the output signal $\overline{Q1}$ is transmitted through pass transistor 55-1 to inverter 52-1 thereby driving the output signal Q1 from inverter 52-1 to high level. Meanwhile, during period t2 the previous low level signal on Q1 has driven the output signal $\overline{Q2}$ of inverter 51-2 to a high level when Q1 was at a high level to enable pass transistor 53-2 and the change in $\phi 2$ from a low level to a high level in the second half of period t2 to enable pass transistor 55-2 to drive the output signal Q2 from inverter 52-2 to a low level. In this manner, the input signal on lead 58 (FIG. 6D) is transmitted through each of the cells 5-1, 5-2, 5-3 et al. in the shift register. Upon the transfer into the shift register of the desired information, the hold signal (FIG. 6C) is enabled (i.e., driven to a high level) thereby to connect the feedback leads 50-1, 50-2, and 50-3 et al. from the output leads of inverters 52 to the input leads of inverters 51 so as to hold the information then in each cell indefinitely. In operation, the signal stored in a given cell, e.g. 5-1, is connected to a configuration control or to an interconnect pass device.

The $\overline{Q}_1$, $Q_1$, $\overline{Q}_2$, $Q_2$, etc., of the shift register are directly connected to the (configuration) control inputs of a logic element or the pass devices of the general interconnect junctions.

When $\phi 1$ is low, $\phi 2$ and hold may be brought high, thus holding the data indefinitely. The entire shift register may be set or cleared by setting or clearing the input with $\phi 1$ and $\phi 2$ both high and HOLD low. Enough set/reset time must be allowed for the signal to propagate the entire length of the shift register to clear the shift register in this manner. Naturally this time is dependent upon the length of the shift register.

The shift register operates in its dynamic phase by storing the information being shifted as charge on the gates of the transistors (not shown in FIG. 5 but well-known) comprising inverters 51-1, 52-1, 51-2, 52-2 et al. of the shift register. These inverters are of well-known design and will not be described in detail. The use of dynamic shift registers is important because a dynamic shift register uses six transistors and thus takes up very little area. The dynamic shift register is converted to a static latch by adding only one transistor. Thus the dynamic shift register (static latch) can be easily fabricated as part of a configurable logic element without adding significant complexity to the circuit or consuming significant semiconductor area. Because of the "hold" signal, the dynamic shift register can become a static latch because placing the shift register on hold automatically refreshes the data. Thus a separate refresh circuit is not needed.

It is apparent from the above description that the dynamic shift register (static latch) circuit does not need refreshing once it has been latched into a hold position. This is accomplished by use of the feedback circuit comprising lead 50-1 and pass transistor 54-1 in cell 5-1, for example.

FIG. 7A shows an additional configurable logic array containing a plurality of configurable logic elements. In particular, configurable logic elements 70-1, 70-2, 70-4 and 70-5 are shown in their entirety while configurable logic elements 70-3, 70-6 and 70-7 through 70-9 are shown partially. In particular, the complete interconnections of these last five logical elements are not shown. The structure shown in FIG. 7A is merely illustrative of the types of configurations and connections which can be implemented using the configurable logic array of this invention and does not depict an actual circuit configured to carry out an intended function.

As shown in FIG. 7A, given leads in the general interconnect structure can be interconnected by various general interconnection junctions. The symbols representing the interconnect junctions shown in FIG. 7A are illustrated in FIG. 7B. In particular, while the schematics depicting various interconnect junctions are to some extent self-explanatory, the conventions used in FIGS. 7B-1 through 7B-7 are further explained in FIGS. 8A through 8G.

Figure 8B:
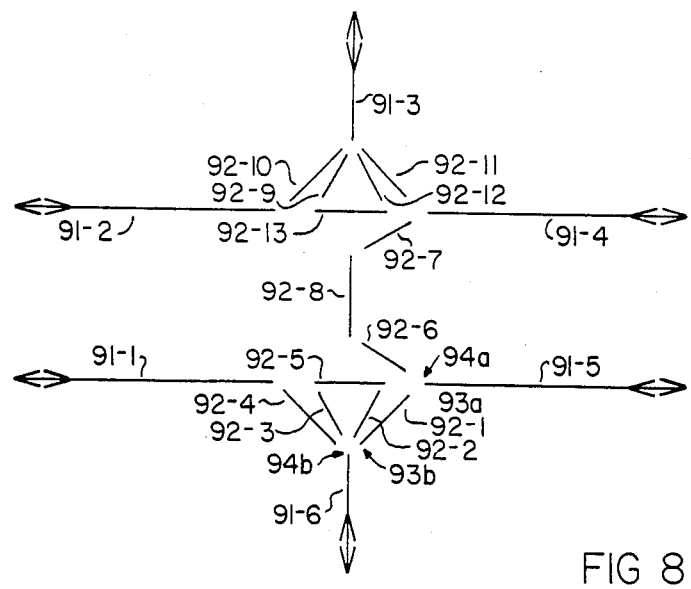

FIG. 8A is the schematic of a circuit for making a number of different interconnections between four leads coming together at a junction point: horizontal leads 90-1 and 90-4 and vertical leads 90-2 and 90-3. Thus, pass transistor 2, when activated into the conducting state, connects lead 90-3 to lead 90-1. Pass transistor 1, when conducting, connects lead 90-3 to lead 90-4. Pass transistor 4, when conducting, connects lead 90-4 to lead 90-2 and pass transistor 3, when conducting, connects lead 90-1 to lead 90-2. Pass transistors 5 and 6, when off, separate leads 90-4 from leads 90-1 and separate lead 90-2 from lead 90-3, respectively. Thus, should it be desired to connect vertical lead 90-2 to vertical lead 90-3, pass transistor 6 is activated. Likewise, should it be desired to connect horizontal lead 90-1 to horizontal lead 90-4, pass transistor 5 is activated. The terminology used to represent the possible connections between a plurality of lead can become quite complex. Thus, a simplified notation system as shown in FIGS. 8B to 8D has been adopted.

In FIG. 8B, a plurality of pass transistors 92-1 through 92-13 are shown. The convention adopted in FIG. 8B is to have a given pass transistor represented by a single short line. Thus, the line labelled 92-1 represents a pass transistor. Pass transistor 92-1 is drawn so that its two ends point to the ends of the leads 91-5 and 91-6 which are interconnected by pass transistor 92-1. Similarly, the right end 93a of pass transistor 92-1 is aimed to the end 94a of lead 91-5. The left end 93b of pass transisor 92-1 is aimed to the end 94b of lead 91-6. For simplicity and to avoid cluttering the drawing in FIG. 8B, the other ends of the transistors are not labelled. However, by visually aligning the line representing a given pass transistor with the ends of the leads 91-1 through 91-6 the particular two leads interconnected by that pass transistor can be determined. Thus, pass transistor 92-7 interconnects horizontal lead 91-4 with horizontal lead 91-1. Pass transistor 92-13 interconnects horizontal lead 91-4 with horizontal lead 91-2. Pass transistor 92-12 interconnects lead 91-3 with lead 91-5. Similar connections can be made between the other pass transistors and the other leads. The table in FIGS. 11 lists the pass transistor connecting lead A with lead B.

The above description assumes that only two leads are to be interconnected. If more than two leads are to be interconnected, the structure of FIG. 8B can also be used for this purpose. Thus, lead 91-3 can be connected to lead 91-2 by turning on pass transistor 92-10. Simultaneously, lead 91-3 can be connected to lead 91-4 by turning on pass transistor 92-13. Alternatively, lead 91-3 could be connected to lead 91-4 by turning on pass transistor 92-11. Of course, this would also connect lead 91-4 through lead 91-3 and pass transistor 92-10 to lead 91-2. In addition, lead 91-6, for example, could be connected to the three leads 91-2, 91-3, 91-4 by turning on pass transistor 92-8. The number of interconnections which can be made using this structure is limited only by the imagination of the designer. In the limit, if all the pass transistors are turned on, all the leads 91-1 to 91-6 are interconnected. The resulting structure has a large capacitance which can actually be used in circuits as a component. Of course, all leads in FIG. 8B can be interconnected by turning on as few as five leads. Note that in FIG. 8B leads 91-1 and 91-2 cannot be directly connected to each other nor can lead 91-4 be directly connected to lead 91-5 without involving another lead. However, this ommission is not of importance because in general in an integrated circuit there is no need for two horizontal leads to carry the same signal. Of course, two additional pass transistors could be added to the structure of FIG. 8B if necessary FIG. 8B is considered to be merely a symbolic representation of intersecting leads and leads 91-1 and 91-2 are merely shown for convenience as being parallel but in fact represent non-parallel leads on an integrated circuit.

Figure 8C:
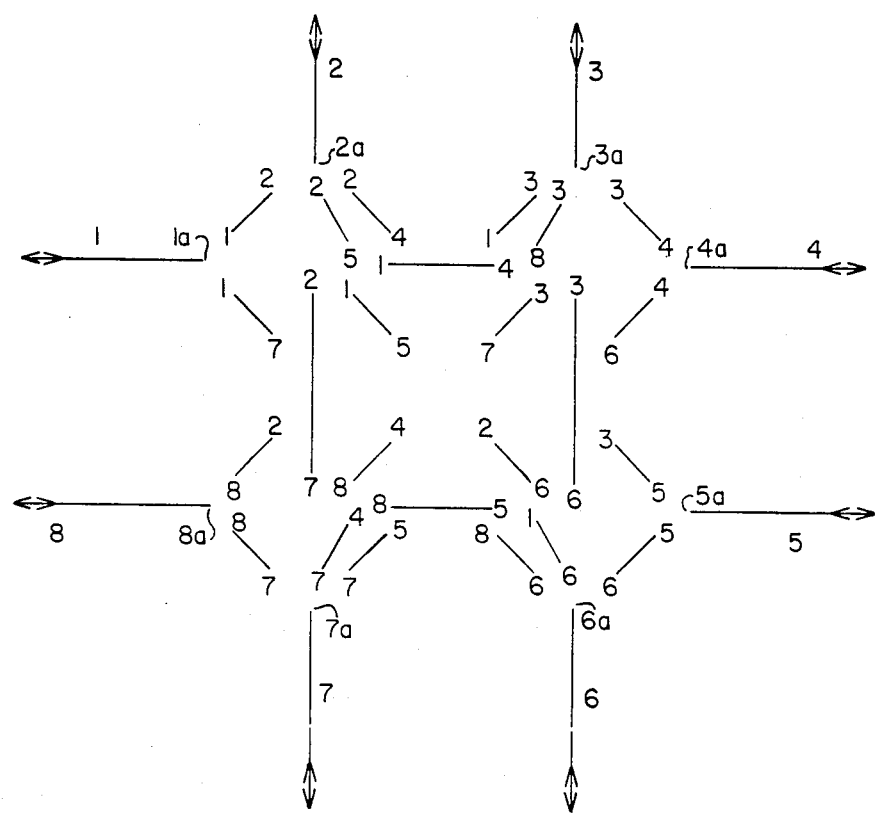

Turning to FIG. 8C another possible interconnection topology is illustrated. In FIG. 8C leads 1 to 8 are shown coming together at a complicated junction. Leads 1 and 8 are parallel horizontal to the left, leads 4 and 5 are parallel horizontal to the right, leads 2 and 3 are parallel vertical up and leads 6 and 7 are parallel vertical down. Looking for a moment at lead 6, the end 6a of lead 6 can be connected sensibly to the ends "a" of leads 1, 2, 3, 4, 5 and 8. It is not sensible to connect lead 6 to lead 7 because theoretically the two leads are going in one direction and only one lead is required to carry the necessary information in that direction. Since lead 6 has six desirable possible connections and each of the other seven leads also has 6 desirable possible connections there are a total of forty-eight desirable possible connections between the eight leads of FIG. 8C. Since a given pass transistor connects two ends, twenty-four pass transistors are required to make the desired forty-eight connections. Each pass transistor has its ends labelled in FIG. 8C to illustrate the leads which are connected by a given pass transistor. Thus, pass transistor 6-8 interconnects the end 6a of lead 6 to the end 8a of lead 8. Pass transistor 7-5 interconnects the end 7a of lead 7 to the end 5a of lead 5. Because of the complexity of the structure of FIG. 8D a slightly different convention (a line with numbers on both ends) has been adopted for representing the pass transistor than was described above in conjunction with FIG. 8B.

FIG. 8D illustrates a configuration similar to that of FIG. 8C with only twenty interconnection transistors rather than the twenty-four shown for the junction in FIG. 8C. As shown in FIG. 8D pass transistors 1-6, 7-4, 2-5 and 8-3 have been deleted from the transistors shown in FIG. 8C.

FIG. 8E illustrates the direct connections that would be possible if the four pass transistors omitted from FIG. 8C were is fact included. (A connection between lead A and lead B is direct if A and B are connected by a single pass transistor.) The dashed lines show the direct interconnections provided by these omitted transistors. FIG. 8D shows only twenty pass transistors whereas twenty-four pass transistors are necessary to make all possible direct connections. FIG. 8F illustrates, however, the way in which it is possible to interconnect leads 4 and 7 without the four transistor connections shown in FIG. 8E being present. Thus, for example, to connect lead 4 to lead 7, lead 4 is connected directly to lead 8 by means of transistor 4-8 while lead 8 is connected to lead 7 by pass transistor 8-7.

Note that each of the interconnections shown above in FIGS. 8A through 8E requires only one pass transistor in order to connect one junction lead to another junction lead while for the particular configuration illustrated in FIG. 8F two pass transistors are required.

FIG. 8G illustrates types of possible interconnections. The leads interconnected are illustrated by showing continuous stright line segments meeting. These interconnections are self-explanatory.

The symbology used in FIGS. 7B-1 through 7B-7 is identical to the symbology just explained in conjunction with FIGS. 8A through 8G. Thus, for example, FIGS. 7B-7 illustrates a solid block involving a twenty pass transistor junction. The twenty transistor interchange shown in FIG. 7B-7 corresponds precisely to the interchange explained in more detail above in conjunction with FIG. 8D.

FIG. 7B-1 illustrates three transistors capable of making a T connection or a crossconnection but not a full interconnection. By full interconnection is meant the ability to connect each of the leads (in FIG. 7B-1, four leads) coming into a junction to any combination of other leads coming into the junction.

FIG. 7B-2 shows a one transistor junction to connect a row with a column. FIG. 7B-3 shows a six transistor full interconnection wherein any one of four leads coming into a junction can be connected to any one of the other three leads coming into the junction. FIG. 7B-4 shows six leads coming into a junction wherein ten pass transistors are used to interconnect any one of the six input leads to any one of the five other leads of the junction. FIG. 7B-5 illustrates a four-lead junction where two horizontal continuous leads are interconnected with two separate vertical leads using five pass transistors.

FIG. 7B-6 illustrates a three-transistor junction wherein any one of three leads coming into a junction can be interconnected with any one of the other two leads. FIG. 7B-7 illustrates the twenty-transistor junction for interconnecting any one of eight input leads to any one of the other eight input leads except that lead parallel and adjacent to the lead being interconnected as illustrated in FIG. 8D and except for the four interconnections shown in FIG. 8E (which also cannot be directly made using the structure of FIG. 7B-7).

A CMOS transmission gate may be used in place of a pass transistor in implementing the interconnections described above.

Frequently, when interconnecting logic elements in a configurable logic array, such as the logic array shown in FIG. 4A, which includes configurable logic elements 40-1 through 40-9, their input and output leads, their access junctions and the general interconnection leads and various general interconnect junctions, it is desired that the output signal from one configurable logic element be connected to only one or two other configurable logic elements. To facilitate interconnection, as a general rule, it is desirable to position the one logic element as close as possible to the other logic element(s) to which it is to be connected.

Figure 9:
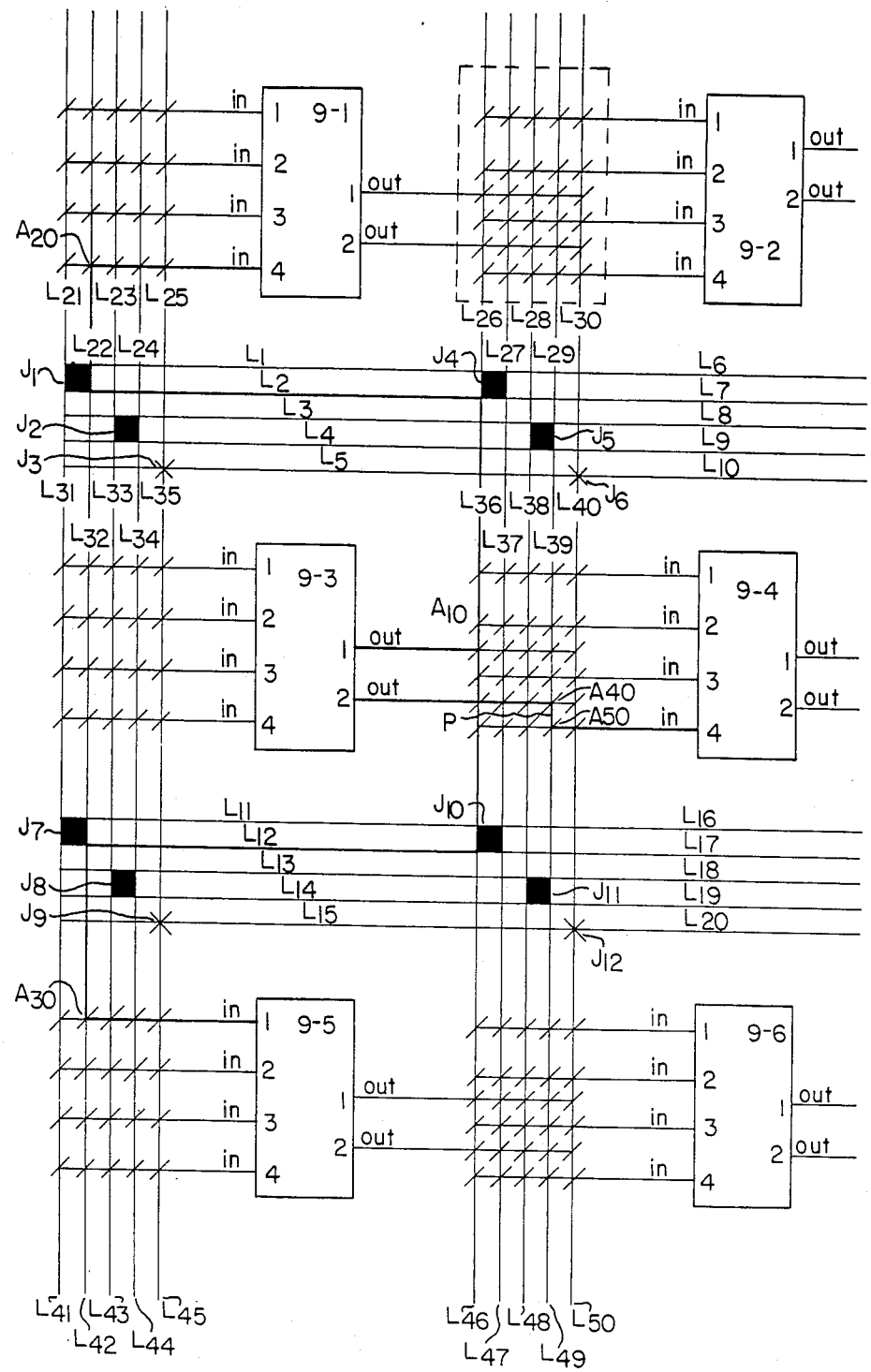
FIG. 9 shows a configurable logic array without the special interconnect circuit of this invention.
Figure 10:
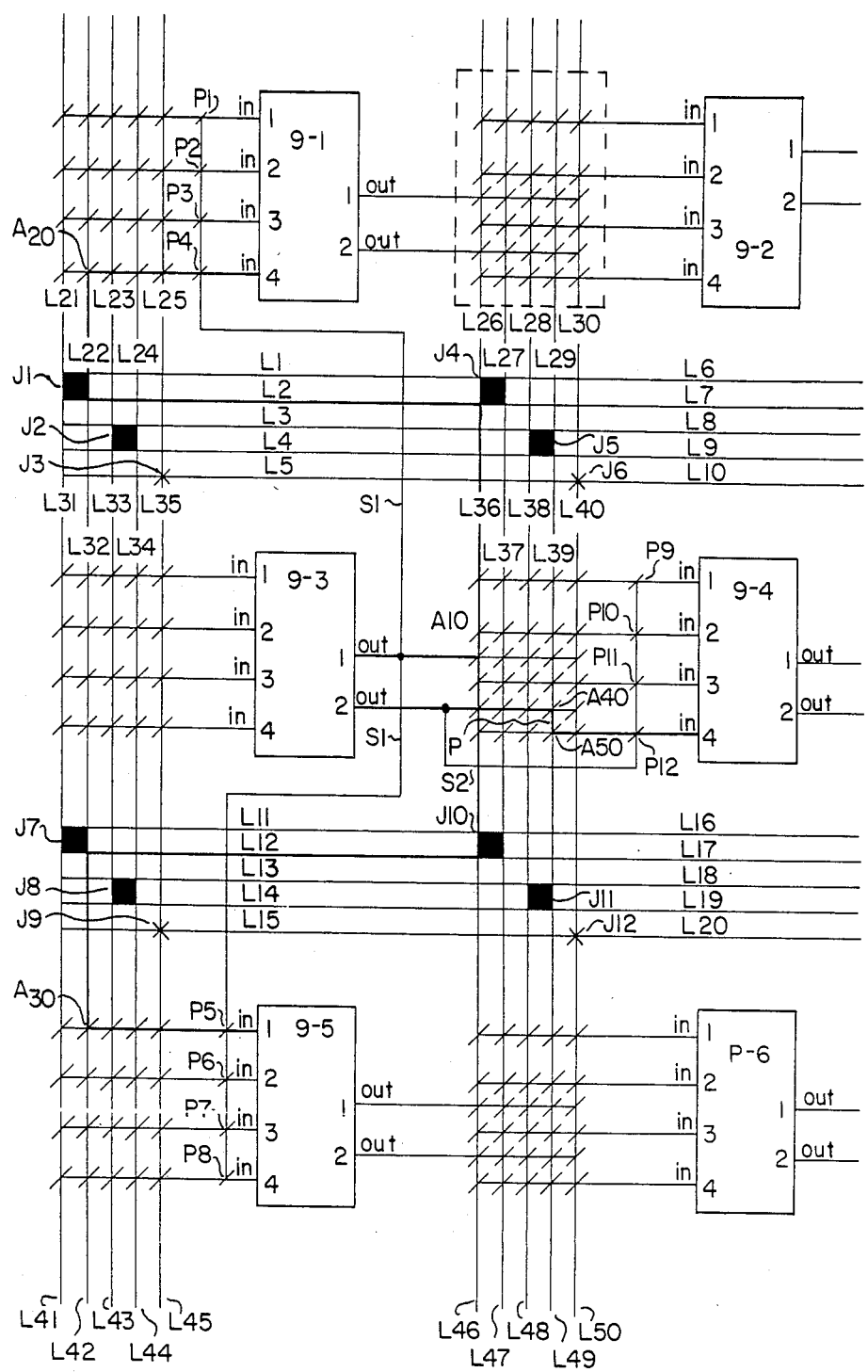
FIG. 10 shows the configurable logic array of FIG. 9 with the special interconnect circuit of this invention.

FIG. 9 shows a portion of a configurable logic array, including configurable logic elements 9-1 through 9-6 and general interconnection leads L1 through L50, together with general interconnect junctions J1 through J12. The junction symbols in FIG. 9 have the same meaning as explained in FIG. 4b. One set of 30 access junctions is indicated by the dotted lines in FIG. 9. This set includes 10 access junctions for the output leads of CLE 9-1 and 20 access junctions for the four input leads of CLE 9-2. The access junctions are not labeled individually for the sake of clarity. Referring to FIG. 9, suppose, for example, that it is desired to connect a signal on output lead 1 of configurable logic element 9-3 to input lead 4 of configurable logic element 9-1, and that simultaneously it is desired to connect the output signal on output lead 1 of CLE 9-3 to input lead 1 of CLE 9-5. In order for the output signal on output lead 1 of CLE 9-3 to arrive at input lead 4 of CLE 9-1, it would be necessary for the signal to pass through at least four junctions, for example, access junction A10, general interconnect junctions J4, general interconnection junction J1 and access junction A20. Similarly, in order to arrive at input lead 1 of CLE 9-5, it would be necessary for the signal on output lead 1 of CLE 9-3 to pass through at least four junctions, for example, access junction 10, general interconnect junction J10, general interconnection junction J7 and access junction A30. Similarly, if it is desired for the output signal on output lead 2 of CLE 9-3 to be connected to input lead 4 of CLE 9-4, it would be necessary for the signal to pass through at least two junctions and at least a portion P of the general interconnect lead L38 between these two junctions. For example, the output signal on lead 2 of CLE 9-3 might pass from output lead 2 via access junction A40 via the marked portion P of general interconnect lead 39 to access junction 50 on input lead 4 of CLE 9-4. Thus, even though configurable logic element 9-3 has been positioned in the configurable logic array shown in FIG. 9 so that it is next to configurable logic array 9-1, 9-5 and 9-4, it is nevertheless necessary for the output signals from CLE 9-3 to pass through several junctions and at least a portion of a general interconnect lead in order to arrive at the proper input lead. This utilization of the general interconnect leads is reduced in one embodiment of the invention by providing each CLE with a special vertical lead which enables one output lead of each configurable logic element to be directly connected to any input lead of the configurable logic element directly above it or below it in the configurable logic and by providing a special horizontal lead circuit which connects the second output of each CLE directly to a selected input lead of the CLE to its immediate right in the configurable logic array. For example, FIG. 10 shows CLE 9-3 provided with a special vertical lead circuit (SVC) of the present invention which connects output lead 1 selectably to each input lead of CLE 9-1 and 9-5 directly above and below CLE 9-3. The SVC circuit includes lead S1 connected to output lead 1 and programmable access junctions P1, P2, P3, P4 for selectively connecting lead S1 with a desired input lead of CLE 9-1. The SVC also includes programmable access junctions P5, P6, P7 and P8 for selectively connecting lead S1 of CLE 9-3 with a desired input lead of CLE 9-5. Similarly, a special horizontal lead circuit (SHC) includes lead S2 connected to output lead 2 of CLE 9-3 and programmable access junctions P9, P10, P11, and P12 for selectively connecting output lead 2 of CLE 9-3 with a desired input lead of CLE 9-4. The access junctions P1 through P12 are only indicated schematically in FIG. 10, however, they each may be implemented by a single pass transistor and programmed in the manner described above for the junctions of the general interconnect structures. The inclusion of such special interconnect circuitry has at least two advantages: first; it may reduce the overall usage of the general interconnect leads and junctions to the point where some of these leads and junctions may be eliminated from the configurable logic array. This, of course, depends on the interconnection demands of the other CLEs in the CLA. Secondly, the speed of the signals through these special interconnection circuits will be improved since the number of transmission gates or pass transistors and the capacitance on the path will be reduced. Provision of special interconnection circuits is particularly useful when implementing MSI type functions, for example shift registers and counters, where adjacent logic elements must be interconnected.

In view of the above description, it will be obvious to one of ordinary skill in the art that various special interconnections between adjacent configurable logic elements in a Configurable Logic Array may be provided without departing from the spirit and scope of the invention.

I claim:

1. A configurable logic array comprising:
    a plurality of configurable logic elements (CLEs), each CLE having at least one input lead and at least one output lead;
    a general interconnect structure comprising a plurality of general interconnect leads and a plurality of programmable general interconnect junctions for interconnecting selected ones of said general interconnect leads;
    one or more input access junctions for each input lead, each of said input access junctions being programmable for connecting a corresponding general interconnect lead to said input lead;
    one or more output access junctions for each output lead, each of said output access junctions being programmable for connecting said output lead to a corresponding general interconnect lead;
    means for programming said general interconnect junctions and said access junctions to provide an electrical path connecting one of said at least one output lead of one of said plurality of CLEs to one of said at least one input lead of one of said plurality of CLEs, said electrical path containing two access junctions and at least a portion of one of said general interconnect leads; and
    at least one special interconnection circuit which permits a selected output lead of one of said CLEs to be connected to a selected input lead of another CLE, said special interconnection circuit not containing any portion of the general interconnect leads or any junction in the general interconnect structure.

2. A configurable logic array as in claim 1 comprising a first, a second, a third and a fourth configurable logic element wherein said second configurable logic element has a first output lead and a second output lead, said at least one special interconnection circuit comprising
    a first special interconnection circuit which permits an output signal on said first output lead of said second configurable logic element to be connected to a selected input lead of said first configurable logic element and which also permits said first output signal to be connected to a selected input lead of said third configurable logic element; and
    a second special interconnection circuit which permits an output signal on said second output lead of said second configurable logic element to be connected to a selected input lead of said fourth configurable logic element.

3. A configurable logic array as in claim 1 wherein said special interconnection circuit comprises a lead connected to said selected output lead and a pass transistor for each input lead of said selected CLE connected between said lead connected to said selected output lead and said corresponding input lead.

* * * * *

UNITED STATES PATENT AND TRADEMARK OFFICE
CERTIFICATE OF CORRECTION

PATENT NO. : 4,642,487
DATED : February 10, 1987
INVENTOR(S) : William S. Carter It is certified that error appears in the above-identified patent and that said Letters Patent is hereby corrected as shown below:

On the cover sheet of this patent, add the following individual as a coinventor:

--Ross H. Freeman, deceased, late of San Jose, California--

Also add at column 1, line 4, the following:

--This patent is a continuation-in-part of U.S. Patent Application Ser. No. 588,478, filed March 12, 1984.--

Signed and Sealed this

Twenty-second Day of August, 2000

*Attest:*

Q. TODD DICKINSON

*Attesting Officer*     *Director of Patents and Trademarks*